(12) United States Patent  (10) Patent No.: US 7,795,912 B2
Danilin et al.  (45) Date of Patent: Sep. 14, 2010

(54) CIRCUIT COMPRISING A MATRIX OF PROGRAMMABLE LOGIC CELLS

(75) Inventors: Alexander A. Danilin, Eindhoven (NL); Martinus T. Bennebroek, Den Bosh (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/521,977

(22) PCT Filed: Dec. 31, 2007

(86) PCT No.: PCT/IB2007/055350

§ 371 (c)(1),
(2), (4) Date: Jul. 1, 2009

(87) PCT Pub. No.: WO2008/084363

PCT Pub. Date: Jul. 17, 2008

(65) Prior Publication Data

US 2010/0085076 A1  Apr. 8, 2010

(30) Foreign Application Priority Data

Jan. 5, 2007 (EP) .................................. 07100165

(51) Int. Cl.
  *H01L 25/00* (2006.01)
  *H03K 19/177* (2006.01)
(52) U.S. Cl. .............................. 326/41; 326/39; 326/47
(58) Field of Classification Search ............. 326/38–39, 326/41, 47
See application file for complete search history.

(56) References Cited

U.S. PATENT DOCUMENTS

| | | | |
|---|---|---|---|
| 5,942,913 A | 8/1999 | Young | |
| 6,903,571 B1 | 6/2005 | Trimberger | |
| 6,992,505 B1 | 1/2006 | Zhou | |
| 7,119,575 B1 | 10/2006 | Schleicher et al. | |
| 7,605,605 B2 * | 10/2009 | Verma et al. | 326/41 |
| 7,694,083 B1 * | 4/2010 | Schmit et al. | 711/154 |
| 2003/0128051 A1 | 7/2003 | Cliff et al. | |
| 2004/0001445 A1 | 1/2004 | Stansfield | |

OTHER PUBLICATIONS

Srinivasan, Suresh, et al; "Leakage Control in FPGA Routing Fabric"; Design Automation Conference 2005; IEEE; Piscataway, NJ, US; pp. 1-4; XP010814419; http://www.cse.psu.edu/~mdl/paper/suresh-aspdac.pdf#search=%22routing%20fabric%20multiplex%22.

* cited by examiner

*Primary Examiner*—Anh Q Tran

(57) ABSTRACT

An integrated circuit comprises a matrix (10) of programmable cells (100). Each particular one of the programmable cells (100) comprises a programmable logic circuit (22) and a bank (24) of routing multiplexers (25*a-d*). Each routing multiplexer (25*a-d*) in the bank (24) has a set of inputs connected to connections selected from a group consisting of connections to an output of the programmable logic circuit (22) and connections dedicated to outputs of routing multiplexers (25*a-d*) in further ones of the programmable cells (100) other than the particular one of the programmable cells (100). The further ones of the programmable cells (100) the inputs of the routing multiplexer (25*a-d*) in the bank (24) are connected to are positioned relative to the particular one of the programmable cells (100) in the matrix (10) in neighboring cells (100) of the particular one of the programmable cells (100) and in cells (100) beyond the neighboring cells (100).

9 Claims, 3 Drawing Sheets

CIRCUIT COMPRISING A MATRIX OF PROGRAMMABLE LOGIC CELLS

FIELD OF THE INVENTION

The invention relates to a circuit comprising a matrix of programmable logic cells.

BACKGROUND OF THE INVENTION

U.S. Pat. No. 6,903,571 describes a field programmable gate array (FPGA) with routing multiplexers to provide connections in a matrix of programmable cells. Conventionally a rectangular matrix is used, with rows and columns of programmable cells. Each cell may contain a logic circuit containing one or more lookup table memories, that stores programmed responses to different combinations of input signal values.

The input signals of the logic circuit of a cell may come from other cells in the matrix. Conventionally such signals are often routed along a "Manhattan routing pattern", which means that the signal route first runs along the direction of a column or row and at a selected cell turn a corner to be routed along a row or column, orthogonally to the original column or row and so on.

The connection route is defined by programmable routing multiplexers. Each cell contains a number of routing multiplexers that are used to supply selected signals to the inputs of the logic circuit of the cell and also to forward signals from a first other cell to a second other cell, for example at a position where the route from the first other cell to the second other cell turns a corner.

In known FPGA's the inputs of routing multiplexers of a cell may be connected to outputs of routing multiplexers of neighboring cells in the matrix, or to global bus conductors that run along an entire row or column of the matrix. However, it has been found that this way of providing signal routes may lead to inefficient use of cells in a matrix of programmable cells.

SUMMARY OF THE INVENTION

Among others it is an object of the invention to provide for a circuit with a matrix of programmable cells that makes it possible to use cells more efficiently.

A circuit according to claim 1 is provided. Herein a matrix of programmable cells is used. A programmable cell comprises a bank of routing multiplexers. Routing multiplexers in the bank have inputs connected to connections that are dedicated to outputs of routing multiplexers in other programmable cells. A connection is dedicated to an output is when is connected to carry signals derived from the output of only one routing multiplexer, no switching to other routing multiplexers being possible. At least part of these other programmable cells are beyond adjacent cells at a greater distance.

In an embodiment different routing multiplexers are provided for different non-overlapping ranges of distances, with inputs connected to dedicated connections of outputs of routing multiplexers only in cells within that range. Thus, for example, routing multiplexers for three ranges of distances may be provided, such as a near range (immediate neighbors), a far range (at least at a distance M, M=6 for example) and a medium range between these near range and the far range. This has been found to make it possible to provide for flexible connections that allows may specified logic functions to be implemented with a relatively small number of routing multiplexers. In addition one or more other routing multiplexers in the bank may be connected to other cells in a range of distances that overlaps with the non-overlapping ranges. Use of a plurality of similar banks in each cell increases this flexibility.

In an embodiment the routing multiplexers are also coupled to an output of the programmable logic of the cell. Thus logic outputs are injected into the matrix.

In an embodiment each routing multiplexer has inputs coupled to routing multiplexers for mutually different ranges. This makes connections more efficient. Preferably the mutually different ranges should be distributed as equally as possible.

In an embodiment the programmable cells with routing multiplexers with outputs that have dedicated connections to a particular cell are positioned only in substantially the same column or row as the particular cell. This makes connections more efficient

BRIEF DESCRIPTION OF THE DRAWINGS

These and other objects and advantageous aspects will become apparent from a description of exemplary embodiments, using the following Figures.

DETAILED DESCRIPTION OF EXEMPLARY EMBODIMENTS

Figure 1:
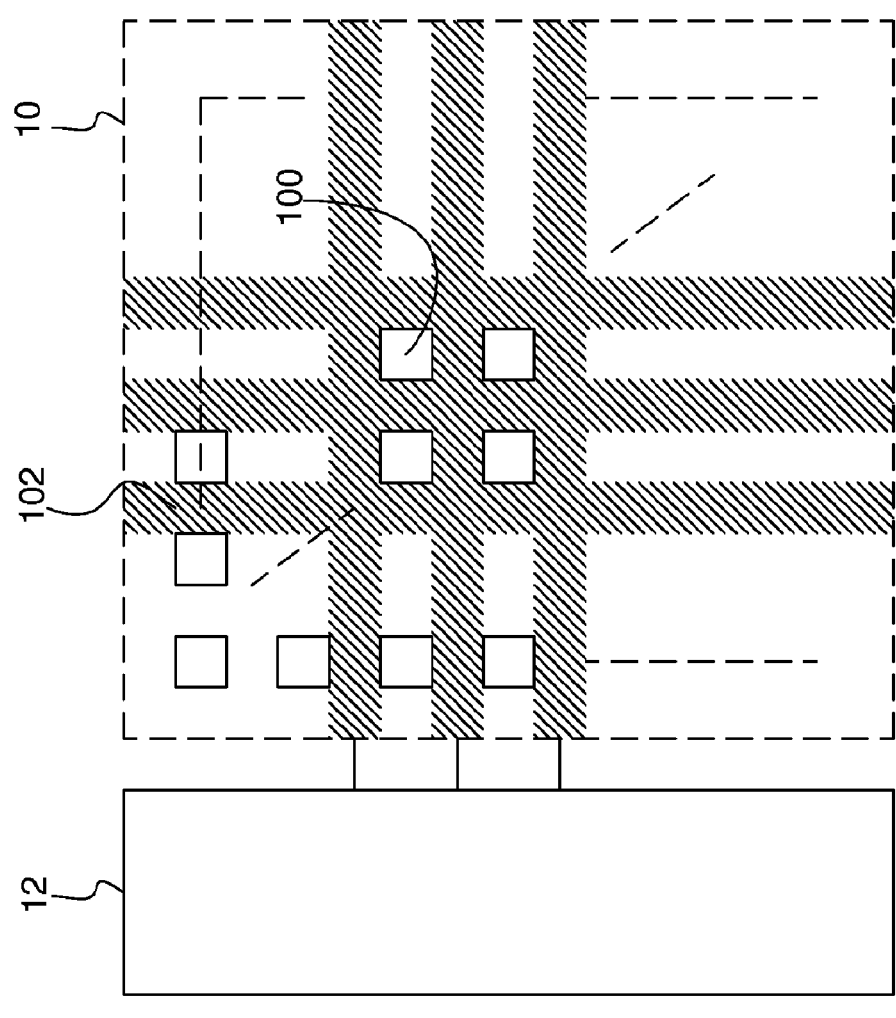
FIG. 1 shows a circuit with a matrix of programmable cells

FIG. 1 shows a circuit with a matrix 10 of programmable cells 100 (only one explicitly labelled). The circuit may contain further circuits 12 coupled to the cells. The matrix comprises sets 102 of connection conductors between the cells and to further circuits 12 or external terminals. For the sake of clarity the sets 102 of connections are only shown symbolically: no specific conductors are shown. Also, although the sets 102 are shown adjacent to the cells 100, it should be understood that in practice the conductors of the sets 102 may be provided on top of cells 100. The various components of the circuit may be integrated together in a single integrated circuit.

Figure 2:
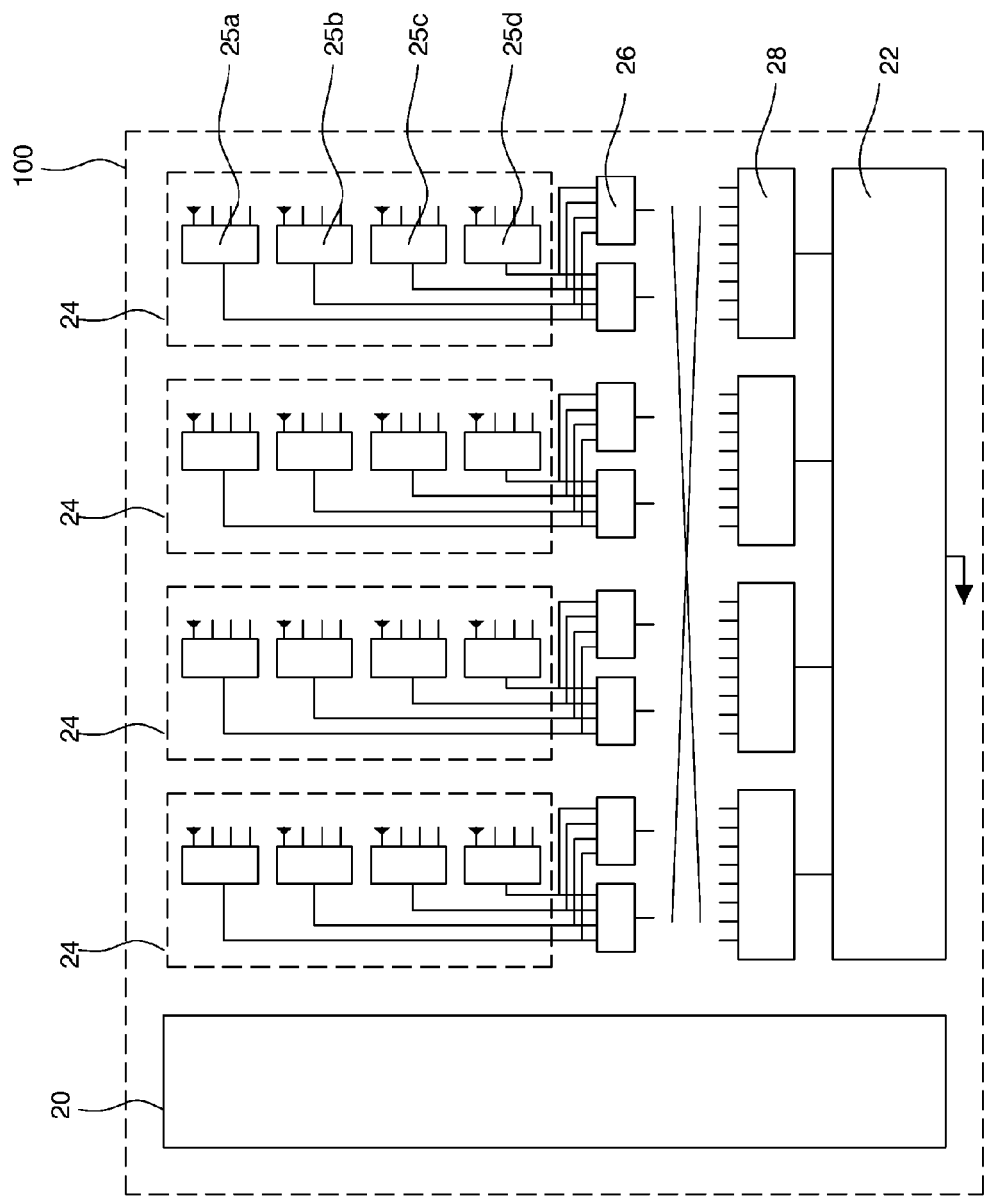
FIG. 2 shows a cell

FIG. 2 shows a cell 100 from matrix 10. Cell 100 comprises a configuration control circuit 20, a configurable logic circuit 22, a plurality of banks 24 of routing multiplexers 25a-d, a first layer of connection multiplexers 26 and a second layer of connection multiplexers 28. Configuration control circuit 20 has outputs (not shown) coupled to configuration control inputs of configurable logic circuit 22, the routing multiplexers 25a-d, connection multiplexers 26 in first layer and connection multiplexers 28 in the second layer. In addition the circuit may contain registers (not shown) between the various circuits for intermediate storage of data.

Configuration control circuit 20 is provided to configure the circuit. Configuring means that semi-permanent circuit connections and/or logic functions are set up that remain the same unless the configuration is changed. The configuration may be controlled by stored control data, for example in non-volatile storage circuits, or by one time programmed circuits such as fuses. Setting the control data and/or one time programming is termed configuring, or equivalently programming. Although configuration control circuit 20 is shown as a single circuit, it may in fact be a distributed circuit with respective parts for respective configured multiplexers and logic circuits, or it may even be part of the configured circuits. Although configurable logic circuit 22 is shown as one block, it should be appreciated that it may comprise a plurality of mutually similar modules. Configurable logic circuit 22 may comprise a lookup table memory that stores configuration data defining output signal values for various combinations of input signal values. Routing multiplexers 25a-d, 26, 28 are preferably unidirectional multiplexers, that is, they pass signals only from input to output and not in the reverse direction from output to input. This simplifies the circuit.

The input connections of routing multiplexer 25a-d will be discussed in the context of another Figures. Therefore these connections are not shown in detail. The first layer of connection multiplexers 26 comprises multiplexers associated with respective ones of the banks 24. Each connection multiplexer 26 of the first layer has inputs coupled to outputs of respective ones of the routing multiplexers 25a-d in the associated bank. More than one connection multiplexer 26 of the first layer may be associated with a same bank.

The second layer of connection multiplexers 28 comprises connection multiplexers 28 associated with respective inputs of configurable logic circuit 22. Each of the connection multiplexers 28 of the second layer has inputs coupled to outputs of connection multiplexers 26 of the first layer. Each connection multiplexers 28 of the second layer has an output coupled to the associated input of configurable logic circuit 22. Configurable logic circuit 22 has an output coupled to an input of each of routing multiplexers 25a-d. Although not shown, configurable logic circuit 22 may have one or more further outputs coupled to inputs of each of routing multiplexers 25a-d.

By way of example four banks 24 of four eight-input routing multiplexers 25a-d are shown, with two four bit connection multiplexers 26 per bank in the first layer (each with inputs coupled to outputs of all routing multiplexers 25a-d in the bank) and eight-bit connection multiplexers 28 in the second layer (each with inputs coupled to outputs of all connection multiplexers 26 in the first layer). This provides for a flexible connection capability, but alternatively other numbers of multiplexers, numbers of inputs, connections etc. may be used.

In practical use configuration data is programmed into the configuration control circuit 20. The configuration data controls selection of the inputs of the multiplexers from which the multiplexers feed signals to their output. The configuration data also controls the logic input/output relation of the configurable logic circuit 22. The configuration data is selected dependent on a specified logic function that must be performed by the matrix. Generally, the specified logic function is divided into parts that are assigned to the configurable logic circuits 22 of respective cells and the multiplexers. The routing multiplexers 25a-d must be configured to connect the assigned configurable logic circuits 22 of different cells according to the specified logic function. Such connections can be indirect (via a routing multiplexer 25a-d of a third block) or direct (involving only the routing multiplexers of the connected configurable logic circuits 22). As will be appreciated the number of routing multiplexers 25a-d limits the number of connections that can be provided. Therefore it is desirable to limit the number of indirect connections that is needed.

Each routing multiplexer 25a-d in a bank 24 of a cell 100 has inputs coupled to outputs of routing multiplexers 25a-d of other cells via sets 102 of connections. In turn the routing multiplexers 25a-d have outputs coupled to inputs of routing multiplexers 25a-d of other cells. The connections that are used to provide this coupling are dedicated to respective outputs of routing multiplexers 25a-b, in the sense that each of these connections is connected to carry signals derived from the output of only one routing multiplexer 25a-d, and no other signals. In other words, there are no switches, multiplexers etc that could replace the signal derived from the output of that routing multiplexer 25a-d by an output derived from another routing multiplexer. This prevents use of circuit area for such switches, which is inefficient. As may be noted the routing multiplexers 25a-d provide both for selection of connections for supplying input signals to the configurable logic circuit 22 and for routing to other cells, without passing through configurable logic circuit 22.

FIGS. 3a-d illustrate available connections of inputs of routing multiplexers 25a-d of a first cell 100, that is, the Figures show the connections that are available from which to make a selection by means of the configuration data. FIGS. 3a-d each show a coordinate space of relative positions of cells in matrix 10 with respect to first cell 100. Dots 30 indicate other cells that have routing multiplexers with outputs with dedicated connections that are connected to inputs of a routing multiplexer 25a-d of the first cell 100 (i.e. without intermediate multiplexers). Typically, a dot 30 is shown only if the dedicated connection consists of only a conductor, but alternatively drivers, signal regeneration circuit, registers etc (not shown) may be part of the connection for which a dot 30 is shown. The further a dot 30 from the origin 32 of the coordinate space, the further the distance of the other cell from the first cell 100.

Figure 3A:
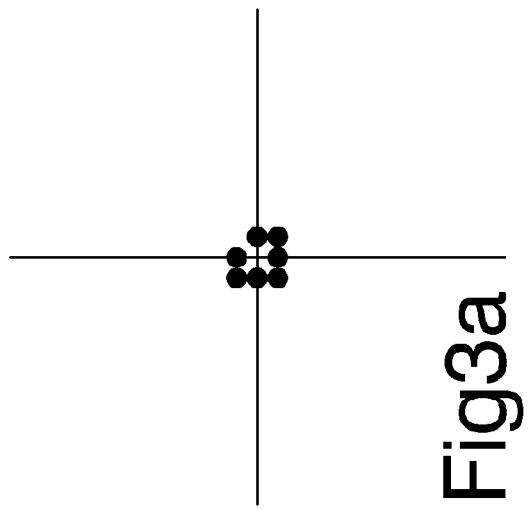
FIGS. 3a-d illustrate connection patterns of a cell

FIG. 3a shows other cells that have routing multiplexers with outputs that are connected to inputs of a first routing multiplexer 25a in a bank 24 via a connection dedicated to the output. As can be seen from the dots 30 all these other cells are immediate neighbors or nearly immediate neighbors of the first cell 100.

Figure 3B:
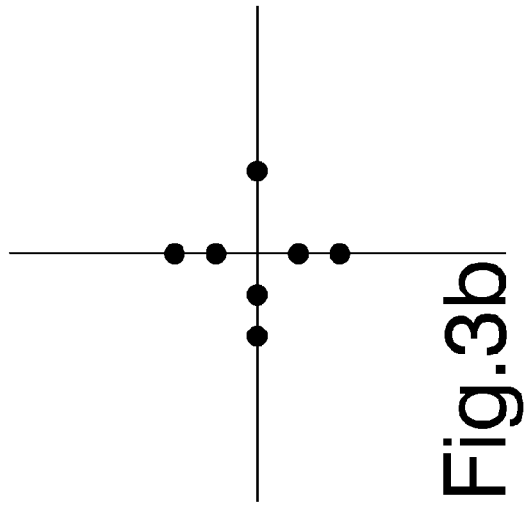

FIG. 3b shows other cells that have routing multiplexers with outputs that are connected to inputs of a second routing multiplexer 25b in a bank 24 via a connection dedicated to the output. As can be seen from the dots 30 all these other cells further away from the first cell 100 than the other cells shown in FIG. 3a for the first routing multiplexer 25a.

Figure 3C:
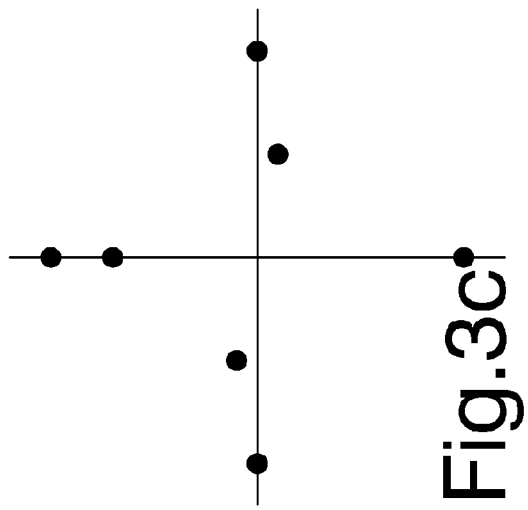
Figure 3D:
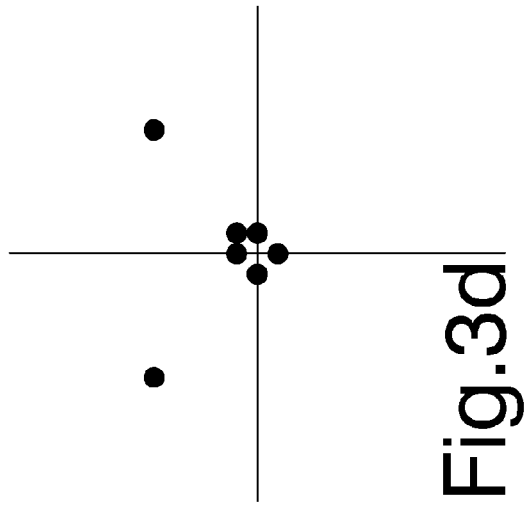

FIGS. 3c,d show other cells that have routing multiplexers with outputs that are connected to inputs of a third and fourth routing multiplexer 25c,d in a bank 24 respectively, via a connection dedicated to the output. As can be seen from the dots 30 the other cells for the third routing multiplexer 25c are further away from the first cell 100 than the other cells for the second routing multiplexer 25b.

Thus, a bank 24 has a plurality of different routing multiplexers 25a-c that each has its own range of distances to other cells (indicated by dots 30) to which the inputs of the routing multiplexer 25a-c are connected via a connection dedicated to the outputs. Distance as used herein may be defined by any measure of distance may be used that yields increasing values when moving further away from the origin 32 in any direction. For example, the Euclidean distance may be used (root of the sum of squares of the coordinate differences in the horizontal and vertical direction), the Manhattan distance (sum of absolute values of the coordinate differences in the horizontal and vertical direction) or the maximum distance (maximum of the absolute coordinate differences in the horizontal and vertical direction).

The ranges of distances for the different routing multiplexers 25a-c in a bank 24 are non-overlapping according to at least one such a measure of distance. In the example of the Figures four routing multiplexers 25a-c are provided in each bank, one for a near range, one for a medium range and one for a far range. Thus, a bank corresponds to a set of ranges of distances. In the example of three routing multiplexers 25a-d for a bank a set of three different ranges is supported. When a plurality of banks 24 of routing multiplexers is provided in a cell 100, preferably each bank 24 comprises routing multiplexers 25a-d for all respective ranges from the same set of ranges of distances. An additional multiplexer 25d is used for a mix of distances that overlaps with the ranges.

It has been found that use of routing multiplexers dedicated to different ranges of distances makes it easier to find efficient implementations of functions wherein a minimum number of routing multiplexers 25a-c is needed for indirect connections between configurable logic circuits 22. Connections to a large choice of cells are possible with a small number of routing multiplexers. As may be noted, routing multiplexers 25a-c form a limited resource for relaying signals between cells (as well as for relaying signals to the configurable logic circuit 22 of the local cell). When one input of a routing multiplexer 25a-c is used, the other input cannot be used. Use of inputs only from a range of distances for a routing multiplexer 25a-c has the effect that selections of inputs for different ranges can be made independently of one another. This facilitates assignment of parts of the specified logic functions to different cells. Thus a high flexibility can be realized with a relatively small number of routing multiplexers.

In a further embodiment, each routing multiplexer 25a-c in a bank 24 of a cell has its inputs coupled to outputs of routing multiplexers 25a-c for a variety of different ranges of distances. This reduces the number of routing multiplexers that is needed to couple any pair of cells.

For each respective routing multiplexer 25a-b in a first cell preferably outputs of routing multiplexers 25a-c in other cells for each of the ranges of distances from the set of ranges are coupled to respective inputs of the respective routing multiplexer 25a-b. Thus in the example of four routing multiplexers 25a-d for a bank each routing multiplexer 25a-d has inputs coupled to routing multiplexers for the near range, the medium near range, the medium far range and the far range. For each range-routing multiplexer combination a connection number can be defined, as the number of the inputs of the routing multiplexer 25a-d that is connected to outputs of routing multiplexers for that range. In a further embodiment, the connections are preferably provided so that the values of these connection numbers do not differ from each other by more than one for any routing multiplexer.

Furthermore it has been found to be advantageous for the efficiency to use mostly and preferably only connections between routing multiplexers of cells in the same row or column of matrix 10. This is illustrated in FIGS. 3a-d by the fact that dots 30 are mainly on or not more than one row or column off the axes. By systematically using the same directions of connections the number of routing multiplexers that is needed to couple any pair of cells is reduced.

The first and second layers of connection multiplexers 26, 28 provide for connections from the banks 24 of routing multiplexers 25a-d to the inputs of configurable logic circuits 22. Preferably the layers provide for contention free connectability of any routing multiplexer to any input of configurable logic circuit 22. Preferably for each routing multiplexer 25a-d in a bank 24 of a cell all other banks in the cell have a corresponding routing multiplexer 25a-d with the identical input connections. In this case two connection multiplexers 26 in the first layer per bank 24 suffice for four inputs of configurable logic circuits 22 to provide for contention free connectability.

It will be understood that the connections of programmable cells near boundaries of matrix 10 may differ from cells away from the boundaries. In this sense matrix 10 can be regarded to be composed of a core matrix and a periphery, wherein the cells in the core matrix have the properties described in the preceding and the cells in the periphery may have different properties.

Although an embodiment has been shown wherein routing multiplexers 35a-c are used for different, non-overlapping ranges in each bank it should be appreciated that alternatively all routing multiplexers may have overlapping ranges. This may make routing less efficient. In each case, when each routing multiplexer has inputs coupled to routing multiplexers in a set of other cells, the sets of other cells for different routing multiplexers 25a-d in a bank are preferably all different from one another. In an embodiment the sets may partly overlap, but to increase flexibility the overlap preferably is limited to directly adjacent cells, as shown in FIGS. 3a-c.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An integrated circuit comprising a matrix of programmable cells, each particular one of the programmable cells comprising:
   a programmable logic circuit;
   a bank of routing multiplexers, each routing multiplexer in the bank having a set of inputs connected to connections selected from a group consisting of connections to an output of the programmable logic circuit and connections dedicated to outputs of routing multiplexers in further ones of the programmable cells other than the particular one of the programmable cells, the further ones of the programmable cells that the inputs of the routing multiplexer in the bank are connected to being positioned relative to the particular one of the programmable cells in the matrix in neighboring cells of the particular one of the programmable cells and in cells beyond the neighboring cells.

2. An integrated circuit according to claim 1, wherein the further ones of the programmable cells for respective ones of the routing multiplexers are positioned relative to the particular one of the programmable cells in the matrix at a distance within respective ranges of one or more distances from the particular one of the programmable cells, the respective ranges being mutually different, non-overlapping ranges, the respective ones of the routing multiplexers having only connections dedicated to outputs of routing multiplexers of the further ones of the programmable cells in the associated respective range of distances and/or to the output of the programmable logic circuit of the particular one of the programmable cells.

3. An integrated circuit according to claim 1, wherein each routing multiplexer of the bank has at least one input coupled to the programmable logic circuit of the particular one of the programmable cells, all remaining inputs of the routing multiplexer being coupled to the outputs of routing multiplexers in further ones of the programmable cells other than the particular one of the programmable cells.

4. An integrated circuit according to claim 1, wherein each particular one of the programmable cells comprises a plurality of said banks.

5. An integrated circuit according to claim 2, wherein each routing multiplexer in the particular one of the programmable cells has inputs coupled to the dedicated connections of outputs of routing multiplexers for each of the set of ranges in the further ones of the programmable cells.

6. An integrated circuit according to claim 2, wherein each of the respective ones of the routing multiplexers in the particular one of the programmable cells has respective numbers of one or more inputs coupled to the dedicated connections of outputs of routing multiplexers for respective ranges, said numbers differing by no more than one for different inputs.

7. An integrated circuit according to claim 2, wherein the further ones of the programmable cells for the respective ones of the routing multiplexers are positioned only in a same column or a same row in the matrix as the particular one of the programmable cells, or in a column or row immediately adjacent said same column or same row.

8. An integrated circuit according to claim 1, each particular one of the programmable cells comprising connection multiplexers coupled between the outputs of the routing multiplexers of the particular one of the programmable cells and inputs of the programmable logic circuit.

9. An integrated circuit according to claim 1, wherein the connection multiplexers comprise a first and second layer of connection multiplexers, the connection multiplexers in the first layer having inputs coupled to the outputs of each of the routing multiplexers in the bank, the connection multiplexers in the second layer having outputs coupled to respective inputs of the programmable logic circuit and inputs coupled to outputs of the connection multiplexers of the first layer.

* * * * *